(12) United States Patent
Katayama

(10) Patent No.: US 7,985,807 B2
(45) Date of Patent: Jul. 26, 2011

(54) THERMOSETTING COMPOSITION

(75) Inventor: Hiroyuki Katayama, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 21 days.

(21) Appl. No.: 12/549,956

(22) Filed: Aug. 28, 2009

(65) Prior Publication Data

US 2010/0075158 A1    Mar. 25, 2010

(30) Foreign Application Priority Data

Sep. 22, 2008  (JP) ................................ 2008-242653

(51) Int. Cl.
*C08L 83/04* (2006.01)

(52) U.S. Cl. ........... 525/476; 525/477; 528/16; 524/268

(58) Field of Classification Search ........................ None
See application file for complete search history.

(56) References Cited

U.S. PATENT DOCUMENTS

| | | | |
|---|---|---|---|
| 3,971,747 A | 7/1976 | Bank et al. | |
| 4,082,719 A * | 4/1978 | Liles et al. | 523/435 |
| 5,618,631 A * | 4/1997 | Meguriya et al. | 428/513 |
| 6,831,145 B2 * | 12/2004 | Kleyer et al. | 528/23 |
| 2005/0244649 A1 | 11/2005 | Kashiwagi et al. | |
| 2009/0227757 A1 | 9/2009 | Katayama et al. | |

FOREIGN PATENT DOCUMENTS

| | | |
|---|---|---|
| JP | 11-302499 | 11/1999 |
| JP | 2007-9086 | 1/2007 |

OTHER PUBLICATIONS

U.S. Appl. No. 12/419,618, filed Apr. 7, 2009, Katayama.
U.S. Appl. No. 12/553,227, filed Sep. 3, 2009, Katayama.
Office Action issued Oct. 21, 2010, in European Patent Application No. 09 010 934.9-1214.

* cited by examiner

*Primary Examiner* — Marc S Zimmer
(74) *Attorney, Agent, or Firm* — Oblon, Spivak, McClelland, Maier & Neustadt, L.L.P.

(57) ABSTRACT

A thermosetting composition containing an aluminosiloxane, a silicone oil containing silanol groups at both ends, an epoxy silicone, and a silicone elastomer. The thermosetting composition of the present invention can be used for, for example, encapsulating materials, coating materials, molding materials, surface-protecting materials, adhesive agents, bonding agents, and the like. Especially, in a case where the thermosetting composition of the present invention is used as an encapsulating material, the thermosetting composition is suitably used for, for example, photosemiconductor devices mounted with blue or white LED elements (backlights for liquid crystal displays, traffic lights, outdoor big displays, advertisement sign boards, and the like).

15 Claims, No Drawings

THERMOSETTING COMPOSITION

FIELD OF THE INVENTION

The present invention relates to a thermosetting composition and a photosemiconductor device obtained by using the composition.

BACKGROUND OF THE INVENTION

Conventionally, epoxy resins have been widely used in many ways for encapsulation of an LED element (for example, Japanese Patent Laid-Open No. Hei 11-302499). However, in an LED device with high brightness which is in need of an application to general illuminations, a material for encapsulation of a photosemiconductor element having light fastness in order to meet the need of high brightness, and transparency, while having heat resistance in order to meet the need of an increase in an amount of heat generated upon lighting-up is desired.

SUMMARY OF THE INVENTION

The present invention relates to:
[1] a thermosetting composition containing an aluminosiloxane, a silicone oil containing silanol groups at both ends, an epoxy silicone, and a silicone elastomer;
[2] a thermosetting composition obtained or obtainable by the steps of
reacting a silicone oil containing silanol groups at both ends and aluminum isopropoxide to provide a mixture A containing an aluminosiloxane and unreacted silicone oil containing silanol groups at both ends, and
mixing the mixture A with an epoxy silicone, and subsequently with a silicone elastomer; and
[3] a photosemiconductor device containing a photosemiconductor element encapsulated with the thermosetting composition as defined in the above item [1] or [2].

DETAILED DESCRIPTION OF THE INVENTION

In a case where an epoxy resin is used in an LED device with high brightness, there are some disadvantages that the resin does not have sufficient transparency and has low heat resistance, so that the resin is discolored into a yellowish color during lighting-up of an LED element, thereby lowering its brightness.

In addition, improvement in heat resistance, light fastness or the like by using a silicone resin composition is proposed. However, in some cases, a silicone resin composition or a cured product thereof becomes opaque under certain conditions, thereby drastically lowering light transmittance. In addition, in some cases, the discoloration is generated by a residue in a cured product obtained upon use of a catalyst or a solvent, thereby lowering a brightness-maintaining percentage. Therefore, a composition having heat resistance, light transmittance, and brightness-maintaining percentage is desired.

The present invention relates to a thermosetting composition capable of offering excellent heat resistance, light transmittance, and brightness-maintaining percentage, and a photosemiconductor device containing a photosemiconductor element encapsulated with the thermosetting composition.

According to the present invention, a thermosetting composition capable of offering excellent heat resistance, light transmittance, and brightness-maintaining percentage, and a photosemiconductor device containing a photosemiconductor element encapsulated with the thermosetting composition can be provided.

These and other advantages of the present invention will be apparent from the following description.

A feature of the thermosetting composition of the present invention resides in that the thermosetting composition contains an aluminosiloxane, a silicone oil containing silanol groups at both ends, an epoxy silicone, and a silicone elastomer. In the thermosetting composition, it is considered that each of hydroxyl groups of the aluminosiloxane and/or the silicone oil containing silanol groups at both ends, and a highly reactive epoxy group of the epoxy silicone are reacted and crosslinked, at the same time the silicone elastomer is crosslinked by a hydrosilylation reaction therewith, so that a compound having transparency, a large number of crosslinking, high crosslinking density and large bond energy is synthesized, whereby the thermosetting composition offers excellent light transmittance and heat resistance. In addition, it is considered that these compounds do not absorb the light in the ultraviolet region in which an organic substance is degraded, and is less likely to undergo photodegradation, and further do not contain a catalyst or a solvent that causes discoloration, whereby the thermosetting composition offers excellent brightness-maintaining percentage in an encapsulated product.

In the present invention, the aluminosiloxane may be a compound having three units of poly(dimethyl siloxanes) each bound to an aluminum atom via an oxygen atom as a backbone, from the viewpoint of compatibility with the epoxy silicone. It is preferable that the aluminosiloxane is a compound represented by the formula (I):

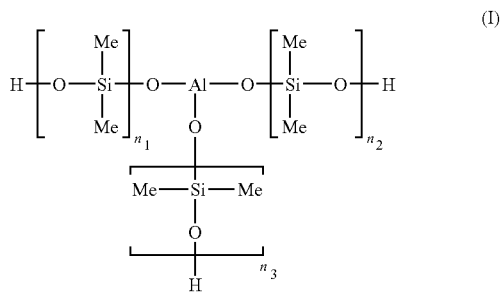

wherein an average of $n_1$ to $n_3$ is from 40 to 155.

The average of $n_1$ to $n_3$ in the formula (I) is preferably from 1 to 155, and more preferably from 40 to 155.

The aluminosiloxane is contained in an amount of preferably from 0.01 to 10% by weight, and more preferably from 0.1 to 5% by weight of the thermosetting composition, from the viewpoint of reactivity and strength of a cured product.

It is desirable that an aluminosiloxane, for example, obtained by reacting a silicon-containing compound and an aluminum compound described later is used.

The silicon-containing compound includes silicone oils containing silanol groups at both ends, such as poly(dimethyl siloxanes) containing silanol groups at both ends, silicone oils containing a silanol group at one end, silanol and disilanol, from the viewpoint of reactivity. Among them, it is preferable to use the silicone oil containing silanol groups at both ends.

In the present invention, it is preferable that the silicone oil containing silanol groups at both ends is a compound represented by the formula (II):

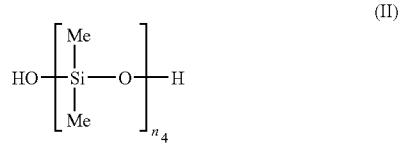

wherein $n_4$ is from 40 to 155.

$n_4$ in the formula (II) is preferably from 1 to 155, and more preferably from 40 to 155.

The silicone oil containing silanol groups at both ends has a number-average molecular weight of preferably from 100 to 100,000, and more preferably from 3,000 to 15,000.

Commercially available products of the silicone oil containing silanol groups at both ends include X-21-5842 (commercially available from Shin-Etsu Chemical Co., Ltd.), KF-9701 (commercially available from Shin-Etsu Chemical Co., Ltd.), and the like.

The aluminum compound includes aluminum methoxide, aluminum ethoxide, aluminum isopropoxide, aluminum butoxide, and the like, and these aluminum compounds can be used alone or in a combination of two or more kinds. Among them, it is preferable to use aluminum isopropoxide. Commercially available products of the aluminum isopropoxide include aluminum isopropoxide such as 016-16015 manufactured by Wako Pure Chemicals Industries, Ltd.

It is preferable that the silicon-containing compound and the aluminum compound used in the synthesis reaction of an aluminosiloxane are in a weight ratio, i.e. silicon-containing compound/aluminum compound, of from 5/1 to 1000/1.

The reaction of the silicon-containing compound and the aluminum compound can be carried out, for example, at a temperature of from 20° to 100° C. for 1 to 24 hours, while stirring in the absence of a solvent. Thereafter, insoluble substances are removed by centrifugation, and the solution is concentrated under a reduced pressure preferably at a temperature of from 40° to 100° C. for preferably 1 to 6 hours, whereby an aluminosiloxane can be obtained, without being limited thereto.

In the present invention, in a case where the aluminosiloxane is synthesized by reacting the silicone oil containing silanol groups at both ends and the aluminum isopropoxide, not only the aluminosiloxane but also the unreacted silicone oil containing silanol groups at both ends may be present in a mixture (reaction mixture). Therefore, in the present invention, a mixture obtained by reaction of synthesis of an aluminosiloxane, which contains an aluminosiloxane and the unreacted silicone oil containing silanol groups at both ends (hereinafter also referred to as a "mixture A"), or an aluminosiloxane and a silicone oil containing silanol groups at both ends that are separately prepared can be used in the preparation of the thermosetting composition. Here, the mixture A can be prepared by properly adjusting a ratio of an amount of each of the silicone oil containing silanol groups at both ends and aluminum isopropoxide used in the reaction. It is preferable that the mixture A is used in the preparation of the thermosetting composition, from the viewpoint of the operability of obtaining the thermosetting composition.

The aluminosiloxane obtained by the reaction and the silicone oil containing silanol groups at both ends that remains unreacted are in a weight ratio, i.e. aluminosiloxane/silicone oil containing silanol groups at both ends, of preferably from 0.1/99.9 to 30/70, and more preferably from 1/99 to 20/80.

The silicone oil containing silanol groups at both ends is contained in an amount of preferably from 5 to 50% by weight, and more preferably from 10 to 30% by weight, of the thermosetting composition, from the viewpoint of reactivity and strength of a cured product.

The epoxy silicone usable in the present invention may be, for example, a compound having compatibility and reactivity to the aluminosiloxane and/or the silicone oil containing silanol groups at both ends, and the epoxy silicone may be a compound such as a compound having a dimethylsilicone backbone, having an epoxy group in a side chain and/or an end of the compound. Among them, it is preferable that the epoxy silicone is a compound having an epoxy group in a side chain, from the viewpoint of viscosity and compatibility. Also, the epoxy group may be an alicyclic epoxy group, and specific alicyclic epoxy groups include an epoxy cyclohexyl, and the like. The epoxy silicone has affinity mutually with the aluminosiloxane and/or the silicone oil containing silanol groups at both ends, and shows compatibility therewith to be homogenized.

The epoxy silicone has an epoxy equivalence of preferably from 300 to 5,000 g/mol, and more preferably from 1,000 to 5,000 g/mol, from the viewpoint of compatibility, reactivity, and strength of the resulting cured product.

The epoxy silicone is contained in an amount of preferably from 10 to 80% by weight, and more preferably from 20 to 50% by weight, of the thermosetting composition, from the viewpoint of strength of a cured product.

Commercially available products of the epoxy silicone include epoxy silicones containing an epoxy group at a side-chain, such as KF-1001 of Shin-Etsu Chemical Co., Ltd.; epoxy silicones containing epoxy groups at a side chain and an end, such as X-22-9002 of Shin-Etsu Chemical Co., Ltd.; epoxy silicones containing an epoxy group at an end, such as X-22-169AS of Shin-Etsu Chemical Co., Ltd.; and the like.

In the present invention, before adding a silicone elastomer, it is preferable that an aluminosiloxane, a silicone oil containing silanol groups at both ends, and an epoxy silicone are mixed, and it is more preferable that a mixture of an aluminosiloxane and an unreacted silicone oil containing silanol groups at both ends (mixture A), and an epoxy silicone are mixed, from the viewpoint of the pot life. The ratio of a total weight of an aluminosiloxane and a silicone oil containing silanol groups at both ends to a weight of an epoxy silicone before the addition of a silicone elastomer, i.e. aluminosiloxane+silicone oil containing silanol groups at both ends/epoxy silicone, is preferably from 10/90 to 70/30, and more preferably from 20/80 to 40/60. Here, a mixture of an aluminosiloxane, a silicone oil containing silanol groups at both ends, and an epoxy silicone may be referred to as hereinafter a "mixture B" in some cases.

It is preferable that the silicone elastomer usable in the present invention contains, for example,
(1) a polysiloxane compound having one or more silicon atom-bound alkenyl groups within a molecule, and
(2) a hydrogenpolysiloxane compound having one or more silicon atom-bound hydrogen atoms within a molecule,
and that the silicone elastomer is cured according to a hydrosilylation reaction between the polysiloxane compound and the hydrogenpolysiloxane compound under heating conditions. In the present specification, the component (1) and the component (2) mentioned above are referred hereinafter to as a silicone elastomer A and a silicone elastomer B, respectively, in some cases.

In the polysiloxane compound, the alkenyl group includes a vinyl group, an allyl group, a propenyl group, a butenyl group and the like. It is preferable that the number of the silicon atom-bound alkenyl groups is one or more. The silicon atom-bound alkenyl group may be present at an end of a molecular chain, a non-end of a molecular chain, or both, of the above polysiloxane compound.

The silicone elastomer A has a viscosity at 25° C. of preferably from 100 to 100,000 mPa·s, and more preferably from 1,000 to 20,000 mPa·s.

The silicone elastomer A is contained in an amount of preferably from 5 to 90% by weight, and more preferably from 10 to 30% by weight, of the thermosetting composition, from the viewpoint of strength of a cured product.

The above hydrogenpolysiloxane compound is a component which acts as a crosslinking agent by a crosslink reaction with the above component (1) to cure. It is preferable that the number of the silicon atom-bound hydrogen atoms is one or more. The silicon atom-bound hydrogen atom may be present at an end of a molecular chain, a non-end of a molecular chain, or both, of the above hydrogenpolysiloxane compound.

The silicone elastomer B has a viscosity at 25° C. of preferably from 100 to 100,000 mPa·s, and more preferably from 1,000 to 20,000 mPa·s.

The silicone elastomer B is contained in an amount of preferably from 5 to 90% by weight, and more preferably from 10 to 30% by weight, of the thermosetting composition, from the viewpoint of strength of a cured product.

The weight ratio of the silicone elastomer A to the silicone elastomer B in the thermosetting composition, i.e. silicone elastomer A/silicone elastomer B is preferably from 40/60 to 60/40, and more preferably from 50/50, from the viewpoint of strength of a cured product.

Commercially available products of the silicone elastomer A and the silicone elastomer B include LR7665-A [silicone elastomer A], LR7665-B [silicone elastomer B] (both commercially available from WACKER ASAHIKASEI SILICONE CO., LTD.), and the like.

The ratio of a total weight of an aluminosiloxane, a silicone oil containing silanol groups at both ends, and an epoxy silicone to a weight of a silicone elastomer in the thermosetting composition, i.e. aluminosiloxane+silicone oil containing silanol groups at both ends+epoxy silicone/silicone elastomer, is preferably from 90/10 to 50/50, and more preferably from 70/30 to 50/50. If the weight of the silicone elastomer is 10 or more to a total weight of the aluminosiloxane, the silicone oil containing silanol groups at both ends, and the epoxy silicone of 90, a curing rate of the thermosetting composition is excellent. On the contrary, if the weight of the silicone elastomer is 50 or less to a total weight of the aluminosiloxane, the silicone oil containing silanol groups at both ends, and the epoxy silicone of 50, the composition can be subjected to encapsulation processing in a semi-cured state, and wires connected to photosemiconductor elements would not be deformed because of an exceeding high viscosity. Here, the silicone elastomer is referred to those containing a silicone elastomer A and a silicone elastomer B.

The thermosetting composition of the present invention is obtained by, for example, the steps of reacting a silicone oil containing silanol groups at both ends and aluminum isopropoxide to provide a mixture A containing an aluminosiloxane and unreacted silicone oil containing silanol groups at both ends, and mixing the mixture A with an epoxy silicone, and subsequently with a silicone elastomer.

In addition, the thermosetting composition can be obtained by mixing immediately before use the above components prepared separately or the above components available commercially.

Besides the above components, the thermosetting composition of the present invention may contain an optional component such as a silicone resin, a silane coupling agent, or inorganic particles of silica or the like.

The thermosetting composition of the present invention has a viscosity at 25° C. of preferably from 1,000 to 50,000 mPa·s, and more preferably from 3,000 to 20,000 mPa·s from the viewpoint of easy paintability. The viscosity can be calculated with a rheometer under the conditions of a temperature of 25° C. and 1 atmospheric pressure.

The thermosetting composition is prepared in a state without a solvent, so that it is preferable that the thermosetting composition is directly used to cure. In addition, it is preferable that the thermosetting composition is sequentially cured by a primary curing into a semi-cured state and a secondary curing into a completely cured state, from the viewpoint of the handling property. Here, the conditions of the primary curing include the conditions of curing at a temperature of from 80° to 200° C. for a period of from 1 to 120 minutes. The conditions of the secondary curing include the conditions of curing at a temperature of from 100° to 200° C. for 1 to 240 hours.

The thermosetting composition of the present invention can be used for encapsulating materials, coating materials, molding materials, surface-protecting materials, adhesive agents, bonding agents, and the like. Especially, in a case where the thermosetting composition of the present invention is used as an encapsulating material, the thermosetting composition is suitably used for, for example, photosemiconductor devices mounted with blue or white LED elements (backlights for liquid crystal displays, traffic lights, outdoor big displays, advertisement sign boards, and the like). Therefore, it is preferable that the thermosetting composition of the present invention is a composition for encapsulating a photosemiconductor element.

In addition, in a preferred embodiment of the present invention, a sheet for encapsulating a photosemiconductor element made from the above thermosetting composition is provided. For example, the sheet for encapsulating a photosemiconductor element can be used by molding the thermosetting composition into a sheet in a semi-cured state. A method for molding the composition into the sheet includes a method including the step of applying a thermosetting composition on the glass plate using a method such as spin-coating, an applicator, casting, or roll-coating, and thereafter subjecting the coating to primary curing as mentioned above. The thermosetting composition has excellent handling property by molding into a sheet in a semi-cured state, and further can be subjected to secondary curing to encapsulate the subject.

The sheet for encapsulating a photosemiconductor element has a thickness of preferably from 100 to 2,000 μm, and more preferably from 300 to 800 μm, from the viewpoint of completely embedding the elements.

The present invention also provides a photosemiconductor device containing a photosemiconductor element encapsulated with the above thermosetting composition.

The photosemiconductor device of the present invention can be produced by encapsulating, for example, LED elements or the like with the above thermosetting composition or the sheet for encapsulating a photosemiconductor element made from the thermosetting composition. Specifically, in a case where the sheet for encapsulating a photosemiconductor element is used, the photosemiconductor device can be produced by mounting the sheet for encapsulating a photosemiconductor element in a semi-cured state in an appropriate thickness according to methods such as casting on a substrate mounted with LED elements, and subjecting the sheet to an encapsulation processing under a reduced pressure, preferably at a temperature of from 50° to 200° C. and a pressure of preferably from 0.05 to 0.5 MPa, and then subjecting the encapsulated sheet to secondary curing including heating the sheet at a temperature of preferably from 100° to 200° C. for a period of preferably from 1 to 240 hours, thereby encapsulating the photosemiconductor elements. In addition, in a case where the thermosetting composition is used, the photosemiconductor device can be produced by directly applying a thermosetting composition in an appropriate thickness to a substrate mounted with LED elements and the like according to a method employing an applicator, casting, spin-coating, roll-coating or the like, thereby encapsulating the photosemiconductor elements under the above conditions for the primary curing and the secondary curing.

EXAMPLES

The following examples further describe and demonstrate embodiments of the present invention. The examples are given solely for the purposes of illustration and are not to be construed as limitations of the present invention.

Synthesis Example 1

Mixture of Aluminosiloxane, Silicone Oil Containing Silanol Groups at Both Ends, and Epoxy Silicone To 200 g (17.4 mmol) of a silicone oil containing silanol groups at both ends [a compound represented by the formula (II), in which $n_4$ is 155, X-21-5842, commercially available from Shin-Etsu Chemical Co., Ltd., number-average molecular weight: 11,500] was added 0.275 g (1.35 mmol) of aluminum isopropoxide (016-16015, commercially available from Wako Pure Chemical Industries, Ltd.), and the components were reacted at room temperature (25° C.) for 24 hours in the absence of a solvent while stirring. Thereafter, the reaction mixture was centrifuged to remove insoluble substances, and the solution was concentrated under a reduced pressure at 50° C. for 2 hours, to provide a mixture (mixture A) containing an aluminosiloxane [a compound represented by the formula (I), in which an average of $n_1$ to $n_3$ is 155] and an unreacted silicone oil containing silanol groups at both ends [a compound represented by the formula (II)] in the form of a colorless, transparent oil (weight ratio: aluminosiloxane/silicone oil containing silanol groups at both ends=12/88). Next, an epoxy silicone (KF-1001, commercially available from Shin-Etsu Chemical Co., Ltd, epoxy equivalence: 3,500 g/mol) was added to the above mixture A, in a proportion, i.e. a weight ratio of mixture A/epoxy silicone, of 30/70, and the mixture was thoroughly stirred into a homogeneous and transparent state, to provide a mixture B.

Synthesis Example 2

Mixture of Aluminosiloxane, Silicone Oil Containing Silanol Groups at Both Ends, and Epoxy Silicone To 200 g (66.7 mmol) of a silicone oil containing silanol groups at both ends [a compound represented by the formula (II), in which $n_4$ is 40, KF-9701, commercially available from Shin-Etsu Chemical Co., Ltd., number-average molecular weight: 3,000] was added 0.275 g (1.35 mmol) of aluminum isopropoxide (016-16015, commercially available from Wako Pure Chemical Industries, Ltd.), and the components were reacted at room temperature (25° C.) for 24 hours in the absence of a solvent while stirring. Thereafter, the reaction mixture was centrifuged to remove insoluble substances, and the solution was concentrated under a reduced pressure at 50° C. for 2 hours, to provide a mixture A containing an aluminosiloxane [a compound represented by the formula (I), in which an average of $n_1$ to $n_3$ is 40] and a silicone oil containing silanol groups at both ends [a compound represented by the formula (II)] in the form of a colorless, transparent oil (weight ratio: aluminosiloxane/silicone oil containing silanol groups at both ends=3/97). Next, an epoxy silicone (KF-1001, commercially available from Shin-Etsu Chemical Co., Ltd, epoxy equivalence: 3,500 g/mol) was added to the above mixture A, in a proportion, i.e. a weight ratio of mixture A/epoxy silicone, of 30/70, and the mixture was thoroughly stirred into a homogeneous and transparent state, to provide a mixture B.

Examples 1 to 3

A silicone elastomer A and a silicone elastomer B (LR7665-A and LR7665-B, respectively, commercially available from WACKER ASAHIKASEI SILICONE CO., LTD.) were mixed, with the mixture B obtained in Synthesis Example 1 or 2 in a weight ratio shown in Table 1, to provide a thermosetting composition in an oily state (viscosity: 6,000 mPa·s). Thereafter, the resulting thermosetting composition was applied to a PET film with an applicator so as to have a thickness of 400 μm. The coating was heated at a temperature of 100° C. for 1 hour, to provide a sheet for encapsulating a photosemiconductor element in a semi-cured state.

The above sheet for encapsulating the photosemiconductor element in a semi-cured state was covered over the substrate mounted with the blue LEDs, and the sheet was heated at 160° C. under a reduced pressure, and encapsulated at a pressure of 0.2 MPa, and further was subjected to secondary curing at 150° C. for 2 hours, to provide a photosemiconductor device.

Comparative Example 1

Forty-five parts by weight of a bisphenol A (BFA)-containing epoxy resin having an epoxy equivalence of 7,500 (EPI 1256, commercially available from Japan Epoxy Resins Co., Ltd.), 33 parts by weight of an alicyclic epoxy resin having an epoxy equivalence of 260 (EHPE3150, commercially available from DAICEL CHEMICAL INDUSTRIES, LTD.), 22 parts by weight of 4-methylhexahydrophthalic anhydride (MH-700, commercially available from New Japan Chemical Co., Ltd.), and 1.2 parts by weight of 2-methylimidazole (2MZ, commercially available from SHIKOKU CHEMICALS, CORPORATION) were dissolved in a MEK solvent on 50% base, to prepare a coating solution. This coating solution was applied to a twin-screw stretched polyester film (commercially available from Mitsubishi Chemical Polyester Film Co., Ltd., thickness: 50 μm) so as to have a thickness of 100 μm, and the coating was dried at 130° C. for 2 minutes. Further, a total of three pieces of the sheet obtained in the same manner as above were thermally laminated at 100° C., to produce an epoxy resin sheet having a thickness of 300 μm.

After a substrate mounted with blue LEDs was heated at 150° C., the above epoxy resin sheet was covered over the blue LEDs on the substrate, the sheet was encapsulated at a pressure of 0.5 MPa, and the sheet was subjected to curing at 150° C. for 2 hours, to provide a photosemiconductor device.
(Evaluation Method)

The sheet for encapsulating a photosemiconductor element, the epoxy resin sheet, and the photosemiconductor device obtained above were evaluated as detailed below. The results are shown in Table 1.

(1) Light Transmittance

The light transmittance at a wavelength of 450 nm was determined for each of the sheets of Examples 1 to 3 and Comparative Example 1, with a spectrophotometer (U-4100, commercially available from Hitachi High-Technologies Corporation).

(2) Heat Resistance

The sheet of each of Examples 1 to 3 and Comparative Example 1 was allowed to stand in a hot air dryer at 150° C. The transparency of each of the sheets after 100 hours passed was visually observed. One that does not undergo any discoloration from the condition before storage is evaluated as ○, and one that shows discoloration from the condition before storage is evaluated as ×.

(3) Brightness-Maintaining Percentage

Electric current of 300 mA was allowed to flow through each of photosemiconductor devices obtained by Examples 1 to 3 and Comparative Example 1, and the brightness immediately after the beginning of the test was determined with MCPD (Multi-Channel Photo-Detector System MCPD-3000, commercially available from Otsuka Electronics Co., Ltd.). Thereafter, the photosemiconductor device was allowed to stand in a state of lighting-up, and the brightness after 300 hours passed was determined in the same manner. The brightness-maintaining percentage was calculated by the following formula:

Brightness-Maintaining Percentage (%) =

$$\frac{\text{Brightness After 300 Hours Passed from Continuous Lighting up at 300 mA}}{\text{Brightness Immediately After the Beginning of the Test}} \times 100$$

TABLE 1

| (Parts by Weight) | Ex. 1 | Ex. 2 | Ex. 3 | Comp. Ex. 1 |
|---|---|---|---|---|
| Thermosetting Composition | | | | |
| Mixture B of Synthesis Example 1 *A-1 | 70 | 50 | — | — |
| Mixture B of Synthesis Example 2 *A-2 | — | — | 70 | — |
| Silicone Elastomer A *B | 15 | 25 | 15 | — |
| Silicone Elastomer B *C | 15 | 25 | 15 | — |
| Bisphenol A-Containing Epoxy Resin *D | — | — | — | 45 |
| Alicyclic Epoxy Resin *E | — | — | — | 33 |
| 4-Methylhexahydrophthalic Anhydride *F | — | — | — | 22 |
| 2-Methylimidazole *G | — | — | — | 1.2 |
| Evaluation | | | | |
| Light Transmittance (%) | 99 | 99 | 99 | 95 |
| Heat Resistance | ○ | ○ | ○ | X |
| Brightness-Maintaining Percentage (%) | >99 | >99 | >99 | 40 |

*A-1: A mixture of an aluminosiloxane, a silicone oil containing silanol groups at both ends, and an epoxy silicone (weight ratio: 3.6/26.4/70)
*A-2: A mixture of an aluminosiloxane, a silicone oil containing silanol groups at both ends, and an epoxy silicone (weight ratio: 0.9/29.1/70)
*B: LR7665-A (commercially available from WACKER ASAHIKASEI SILICONE CO., LTD.; viscosity 15,000 mPa · s)
*C: LR7665-B (commercially available from WACKER ASAHIKASEI SILICONE CO., LTD.; viscosity 15,000 mPa · s)
*D: EPI1256 (commercially available from Japan Epoxy Resins Co., Ltd.)
*E: EHPE3150 (commercially available from DAICEL CHEMICAL INDUSTRIES, LTD.)
*F: MH-700 (commercially available from New Japan Chemical Co., Ltd.)
*G: 2MZ (commercially available from SHIKOKU CHEMICALS CORPORATION)

It can be seen from the above that the thermosetting composition of the present invention has excellent light transmittance and heat resistance, and further that a photosemiconductor device containing a photosemiconductor element encapsulated with the thermosetting composition has excellent brightness-maintaining percentage.

The thermosetting composition of the present invention can be used for, for example, encapsulating materials, coating materials, molding materials, surface-protecting materials, adhesive agents, bonding agents, and the like. Especially, in a case where the thermosetting composition of the present invention is used as an encapsulating material, the thermosetting composition is suitably used for, for example, photosemiconductor devices mounted with blue or white LED elements (backlights for liquid crystal displays, traffic lights, outdoor big displays, advertisement sign boards, and the like).

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermosetting composition comprising:
   an aluminosiloxane;
   a silicone oil comprising silanol groups at both ends;
   an epoxy silicone; and
   a silicone elastomer,
   wherein the silicone oil comprising silanol groups at both ends is a compound represented by the formula (II):

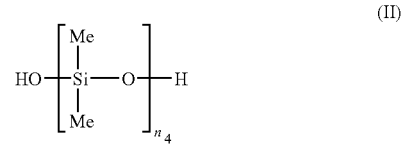

(II)

wherein $n_4$ is from 40 to 155.

2. The thermosetting composition according to claim 1, wherein the aluminosiloxane is a compound represented by the formula (I):

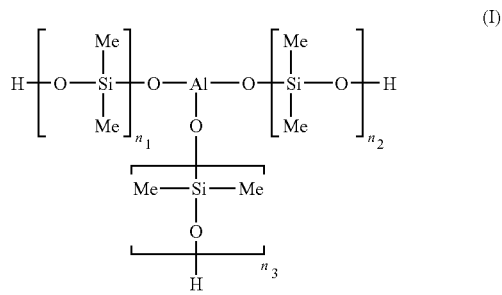

(I)

wherein an average of $n_1$ to $n_3$ is from 40 to 155.

3. A method for encapsulating a photosemiconductor element, comprising encapsulating a photosemiconductor element with the thermosetting composition as defined in claim 1.

4. A photosemiconductor device comprising a photosemiconductor element encapsulated with the thermosetting composition as defined in claim 1.

5. A thermosetting composition obtained by a process comprising:
   reacting a silicone oil comprising silanol groups at both ends and aluminum isopropoxide to provide a mixture A comprising an aluminosiloxane and unreacted silicone oil comprising silanol groups at both ends; and
   mixing the mixture A with an epoxy silicone, and subsequently with a silicone elastomer.

6. The thermosetting composition according to claim 5, wherein the aluminosiloxane is a compound represented by the formula (I):

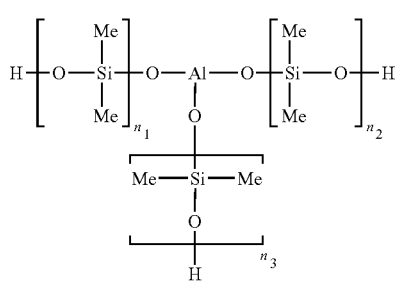
(I)

wherein an average of $n_1$ to $n_3$ is from 40 to 155.

7. The thermosetting composition according to claim 5, wherein the silicone oil comprising silanol groups at both ends is a compound represented by the formula (II):

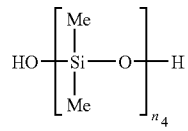
(II)

wherein $n_4$ is from 40 to 155.

8. A method for encapsulating a photosemiconductor element, comprising encapsulating a photosemiconductor element with the thermosetting composition as defined in claim 5.

9. A photosemiconductor device comprising a photosemiconductor element encapsulated with the thermosetting composition as defined in claim 5.

10. The thermosetting composition according to claim 1, wherein the aluminosiloxane is included in an amount of from 0.01 to 10% by weight.

11. The thermosetting composition according to claim 1, wherein the aluminosiloxane is included in an amount of from 0.1 to 5% by weight.

12. The thermosetting composition according to claim 1, wherein the epoxy silicone is included in an amount of from 10 to 80% by weight.

13. The thermosetting composition according to claim 1, wherein the epoxy silicone is included in an amount of from 20 to 50% by weight.

14. The thermosetting composition according to claim 1, wherein a ratio of a total weight of the aluminosiloxane, the silicone oil and the epoxy silicone to a weight of the silicone elastomer is from 90/10 to 50/50.

15. The thermosetting composition according to claim 1, wherein a ratio of a total weight of the aluminosiloxane, the silicone oil and the epoxy silicone to a weight of the silicone elastomer is from 70/30 to 50/50.

* * * * *